United States Patent [19]
Zillman

[11] 4,048,593
[45] Sept. 13, 1977

[54] ELECTRICAL COMPONENT FOR PROVIDING INTEGRATED INDUCTIVE-CAPACITIVE NETWORKS

[76] Inventor: Jack H. Zillman, 30798 Calle Chueca, San Juan Capistrano, Calif. 92675

[21] Appl. No.: 620,967

[22] Filed: Oct. 9, 1975

Related U.S. Application Data

[63] Continuation-in-part of Ser. No. 469,359, May 13, 1974, abandoned, which is a continuation-in-part of Ser. No. 412,827, Nov. 5, 1973, abandoned.

[51] Int. Cl.² .................. H03H 7/04; H03H 13/00; H01G 4/40; H01G 4/32
[52] U.S. Cl. .................. 333/70 R; 333/70 S; 361/304; 361/313; 361/330
[58] Field of Search .......... 333/70 R, 70 S, 70 CR, 333/24 C, 78–79, 29; 317/242, 256, 260; 361/271, 301–313, 320–323, 328–330

[56] References Cited

U.S. PATENT DOCUMENTS

| 217,466 | 7/1879 | Conte | 333/31 C X |
|---|---|---|---|
| 2,565,093 | 8/1951 | Robinson et al. | 333/31 C X |
| 2,599,508 | 6/1952 | Allison | 333/31 C X |
| 2,693,629 | 11/1954 | Denes | 29/25.42 |
| 2,884,605 | 4/1959 | Dubilier | 333/31 C X |
| 3,613,033 | 10/1971 | Denes | 333/79 |

FOREIGN PATENT DOCUMENTS

| 569,700 | 6/1945 | United Kingdom | 317/260 |
|---|---|---|---|
| 743,717 | 1/1956 | United Kingdom | 333/70 CR |

Primary Examiner—Alfred E. Smith
Assistant Examiner—Marvin Nussbaum
Attorney, Agent, or Firm—Jessup & Beecher

[57] ABSTRACT

An integrated electrical component is provided which functions as an inductive-capacitive network, and which may be used, for example, to form a filter, transformer, or the like. The component includes distributed capacitance and inductance with external connections to permit a variety of distributed element configurations, which results in the elimination of spurious electromagnetic radiation from the component and in the packaging of a multiple-pole filter in an extremely compact configuration, so as to provide a variety of filter networks, or the like, each of high quality factor (Q). The component comprises one or more sheets of dielectric material formed, for example, of a ceramic, and having one or more conductive sheets positioned on each dielectric sheet. The resulting assembly is turned into a spiral configuration, as will be described, to form the component, and the resulting assembly is then cured.

5 Claims, 15 Drawing Figures

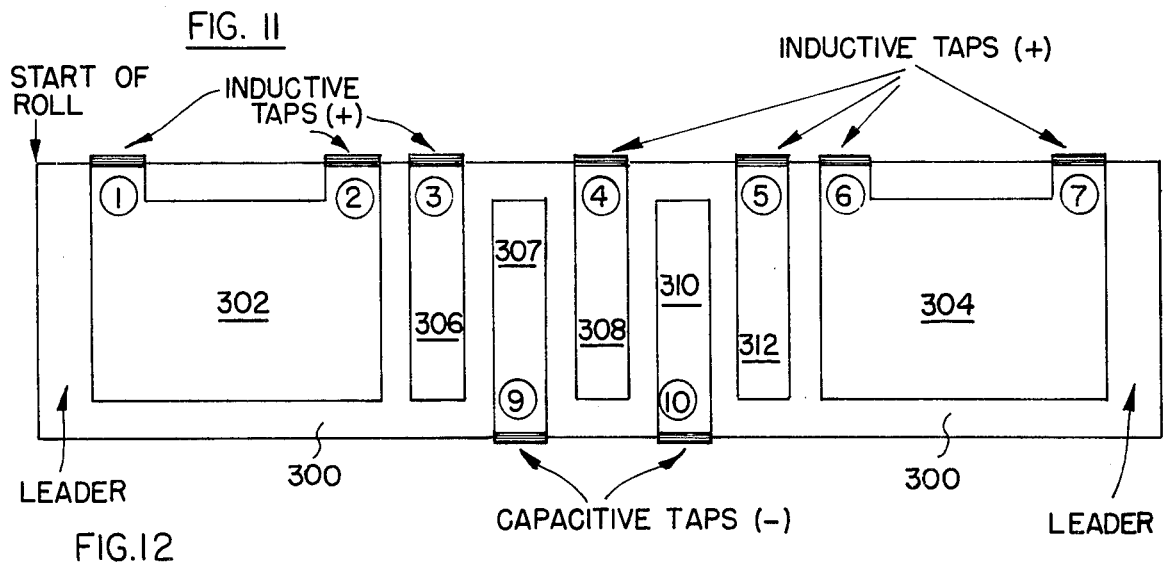

ELECTRICAL COMPONENT FOR PROVIDING INTEGRATED INDUCTIVE-CAPACITIVE NETWORKS

This application is a continuation-in-part of copending application Ser. No. 469,359 filed May 13, 1974, now abandoned, which, in turn, is a continuation-in-part of application Ser. No. 412,827 which was filed Nov. 5, 1973, now abandoned.

BACKGROUND OF THE INVENTION

The invention relates to integrated circuit components which function as a filter network, transformer or the like, and which combine inductance and capacitance in either two terminal or four terminal configurations, and more particularly in multiple-pole filter configurations.

In the past, discrete inductive and capacitive components have been interconnected to form LC resonant circuits for wave signal filtering purposes. Such circuits exhibit well defined impedance characteristics which are frequency dependent. This frequency dependence is a function of the particular inductive and capacitive elements used and is partially defined by the following mathematical relationship defining the resonant frequency of an inductive-capacitive combination:

$$f = \frac{1}{2\pi \sqrt{LC}},$$

$f$ = resonant frequency, Hertz
$L$ = inductance, henrys
$C$ = capacitance, farads Through a proper selection of the inductance and capacitance, the particular LC combination can be made to resonate at virtually any frequency. The effect of such resonance is the ability of the inductive and capacitive components to interreact and thereby effectively cancel the imaginary components of their respective impedances so that, at the resonant frequency, an extremely low impedance exists between the elements themselves. This fact has made is possible, for example, to design high and low-pass filters which have a relatively flat impedance level through a particular band of desired frequencies and which attenuate unwanted frequencies. The degree of attenuation of unwanted frequencies is dependent upon the number of inductance-capacitance sections which are present in the filter, so that is is commonly understood, for example, that a standard Butterworth filter has an attenuation roll-off beyond a cutoff frequency which approximates -18DB per octave for each section. There are, therefore, advantages in being able to produce filters with as many sections; that is, LC combinations, as is physically possible.

Numerous difficulties, however, have impeded attempts by the prior art to achieve multiple section filter combinations suitable for high response filter characteristics. Most of these difficulties have been a direct consequence of the inherent limitations and deficiencies of discrete inductive and capacitive components which have been used almost exclusively in the development and use of filters and related networks. Thus, for example, while the filter circuit made up of discrete components may operate satisfactorily on conducted signals, the circuit elements, and particularly the inductive elements, generate radiated interference signals, particularly magnetic signals, which are difficult to shield and often interfere with the operation of susceptible electronic equipment located adjacent the filter circuit.

Other difficulties encountered in the use of discrete component filter designs are weight and volume limitations which are unavoidable in building multiple section filters, regardless of the attempts to package the various components densely.

In addition, serious cost difficulties arise in the construction of descrete element filters, since in many instances the individual elements must be separately packaged and the overall filter circuit itself must then be packaged, so that the entire cost, including the labor of interconnecting various components, creates a serious limitation on the number of filter sections which are practical to implement for a particular design configuration.

The present invention overcomes the serious limitations mentioned above by providing an integrated capacitive-inductive circuit component which is conveniently packaged as an integrated structure, and which operates effectively as a high resolution wave filter having a large number of sections, if desired. Part of this desirable result is achieved by utilizing elements within the integrated component to operate both as inductive and capacitive elements, primarily by constructing the inductive elements to have exposed conductive surface areas which may be capacitively coupled to one another, or to separate capacitive elements.

The cost of manufacture of such an integrated circuit component is substantially reduced, as evidenced by the cost of other integrated components in the electronic art, while the potential for producing multiple-pole filter sections within a significantly reduced volume and weight is enhanced.

More particularly, the present invention accomplishes the desired results by including an inductive element in the form of a thin conductive sheet which may be shaped to form an inductance coil, and which has a surface area of substantial dimensions. A dielectric means in the form of a thin sheet of electrically insulating substance, such as a ceramic material, is placed adjacent to the surface of the inductive elements and a capacitive element or element in the form of thin sheets of electrically conductive material are placed against the dielectric sheet, so that the inductive element and the capacitaive elements are capacitively coupled through the dielectric sheet.

The basic invention may be implemented by providing a spiral roll including a first thin electrically conductive sheet and a second thin electrically conductive sheet rolled concentric to one another with a thin dielectric sheet interposed between the first and second conductive sheets. Proper terminal connections are provided to permit at least one of the electrical conductive sheets to functions as an inductance coil. The inductance coil is formed with an exposed surface area for capacitive coupling to a second conductive sheet through the dielectric sheet, so that distributed capacitance is generated along the length of the inductive element. the capacitive sheets may be conveniently interrupted to produce a plurality of capacitive sections in order to permit different terminal connections, enabling the circuit component to function as a high-pass filter, low-pass filter, and the like.

Since the entire filter combination is packaged in the component as distributed elements, typically rolled as plural sections, the emanation of spurious radiations may be substantially eliminated. In addition, the circuit component configuration described briefly above permits the place of a magnetically permeable core within the center of the inductive winding to permit an increase in the inductance of the inductive winding, and to provide a means for tuning the resulting filter.

BRIEF DESCRIPTION OF THE DRAWINGS

FIG. 11 is yet another rolled sheet version of a low-pass filter;

FIG. 12 is a circuit diagram of the equivalent circuit of the filter of FIG. 11;

FIG. 13 is a rolled sheet version of a high-pass filter;

FIG. 14 is the equivalent circuit of the filter of FIG. 13; and

FIG. 15 is a modified form of the filter of FIG. 13.

DETAILED DESCRIPTION OF THE ILLUSTRATED EMBODIMENTS

Figure 1:
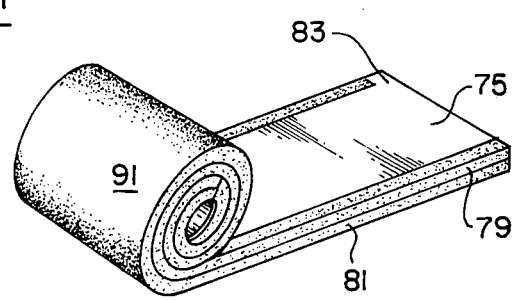
FIG. 1 is a perspective view of one embodiment of the invention, which includes a pair of conductive sheets mounted on respective dielectric sheets, with the assembly partially rolled into a spiral configuration.
Figure 2:
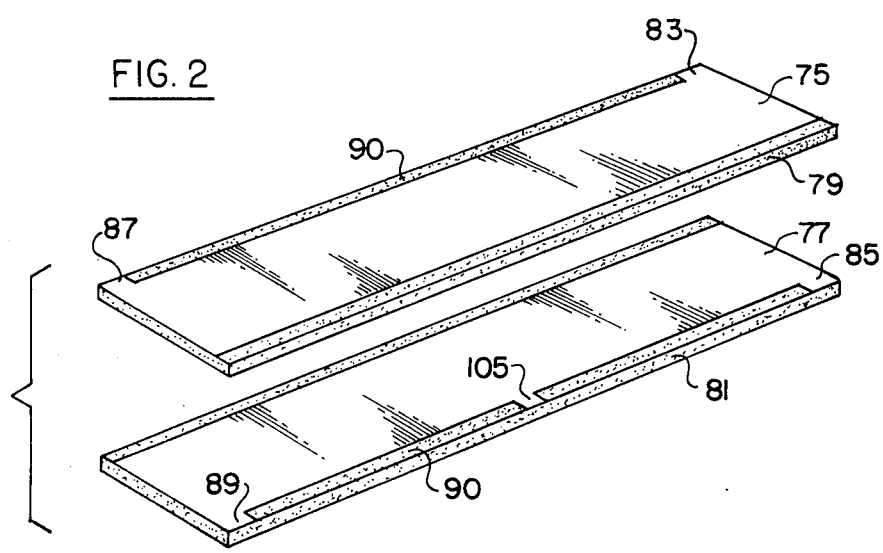
FIG. 2 is a perspective view of the conductive and dielectric sheets of the embodiment of FIG. 1, showing the terminations required for a two or four terminal wave filter network.

The embodiment of FIGS. 1 and 2 include thin sheets of conductive material formed to produce inductive turns, and with the surface of the sheets being used for capacitive coupling to a second series of inductive turns. In the embodiment of FIGS. 1 and 2, the conductive sheets 75 and 77 are formed as long narrow elements and are separated by long narrow thin sheets of dielectric material 79 and 81. These sheets, as best shown in FIG. 2, may be formed with terminals or conductive taps 83, 85, 87 and 89 which are electrically conductive and which form a part of the conductive sheets 75 and 77 to allow external electrical connections to be made to each of the conductive sheets 75 and 77.

As best shown in FIG. 1, the sheets 75 and 79 are stacked on the sheets 77 and 81, and the entire assembly is then rolled, preferably around a mandrel, to form the composite inductive and capacitive circuit element. This embodiment uses the conductive sheets 75 and 77 as inductance elements by forming them into a spiral inductive turns around a centerl hole 91 from which the rolling mandrel is removed after the component has been formed. Pressure may be applied to the layers during the rolling operation to assure that each of the conductive sheets 75 and 77 obtains extremely close contact with the dielectric layers on each side of the sheet, to assure adequate capacitive coupling.

It has been found essential for the conductive sheets 75 and 77 to be imbedded into the respective dielectric sheets 79 and 81, so that the surface of each of the conductive sheets is flush with the surface of the corresponding dielectric sheet. This is necessary in order that the component may be formed regularly when wound about the mandrel, and to avoid the edges from assuming a wave shape which destroys the mechanical integrity of the component, and seriously effects its electrical characteristics. When the conductive sheets are not imbedded, there are spaces between the margins of adjacent convolutions which create cracking and strains on the dielectric sheet; so that the thickness and current-carrying capability of the conductive sheets is severely limited.

When the dielectric sheets 79 and 81 are formed of a ceramic material, the respective conductive sheets 75 and 77 may be imbedded therein during the manufacturing process, by placing the conductive sheets on an elongated glass strip, and by casting the ceramic as a viscous liquid over the conductive sheets. The viscous liquid is allowed to dry, and the resulting sub-assemblies are subsequently spiralled into the assembly of FIG. 1. The sub-assemblies may then be placed in a curing oven, so that the ceramic may be cured.

Figure 3:
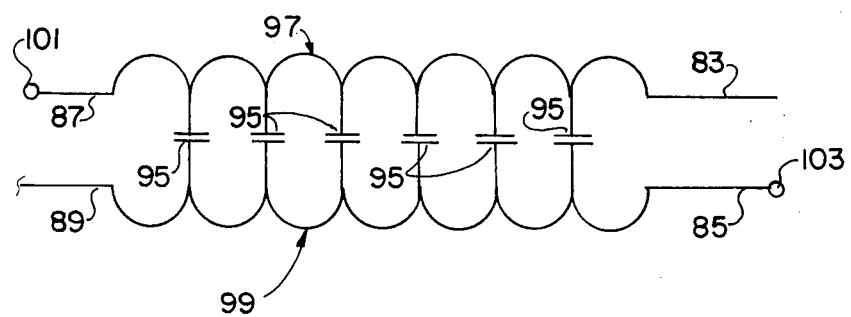
FIG. 3 is a schematic electrical diagram which is the equivalent circuit of the assembly shown in FIGS. 1 and 2.

In the circuit component of FIGS. 1 and 2, both the capacitance and the inductance are distributed elements. This distribution is shown by the schematic representation of the equivalent circuit of FIG. 3 in which the distributed capacitance 95 is shown coupling the series distributed inductive elements 97 and 99. In the schematic diagram of FIG. 3, the terminal connection 87 is shown connected to a terminal 101, and the terminal connection 85 is shown connected to a terminal 103, to form a two terminal filter network. It will be recognized, of course, that a four terminal network may be formed by connecting the conductive terminals 83 and 89 to additional terminal connections for external signal application. The margins 90 separate the edges of the conducitive sheets 75 and 77 from the edges of the dielectric sheets 79 and 81, to assure electrical isolation between the conductive sheets.

Additional conductive terminals or tabs, such as the terminal 105 in FIG. 2, may be added to permit additional external connections to the component to be made. The dielectric elements 79 and 81 of the embodiment of FIGS. 1 and 2 may be a ceramic sheet, as mentioned above, and the manufacturing process would then include the rolling of the elements 75, 77, 79 and 81 about a mandrel placed within the hole 91 under pressure and the later firing of the entire component in order to bond the conductive sheets 75 and 77 to the dielectric sheets 79 and 81 to assure molecular contact between these elements and thereby assure adequate capacitive coupling.

The inductance of the component shown in FIGS. 1 and 2 may be increased by inserting a magnetically permeable core element within the hole 91, and the inductance may be varied by adjusting the position of the core element within the hole.

The embodiment of FIGS. 1 and 2 functions as a high-pass filter. A corresponding low-pass filter configuration may be constructed by using the embodiment shown in FIG. 4. In the latter instance, the first conductive sheet 75 and the first dielectric layer 79 remain unchanged from the embodiment shown in FIGS. 1 and 2. The conductive sheet 77, however, is broken to form a plurality of conductive sheets 115 along the dielectric strip 85, and separated by a plurality of margins 116, with each sheet 115 including a terminal or tab 117 for external connection. The sheets 115 are placed on the dielectric sheet 85 similar to the construction of the embodiments of FIGS. 1 and 2, with the conductive sheet 75 being formed flush in the dielectric sheet 79, and with the sheets 115 being formed flush in the dielectric sheet 85.

Figure 4:
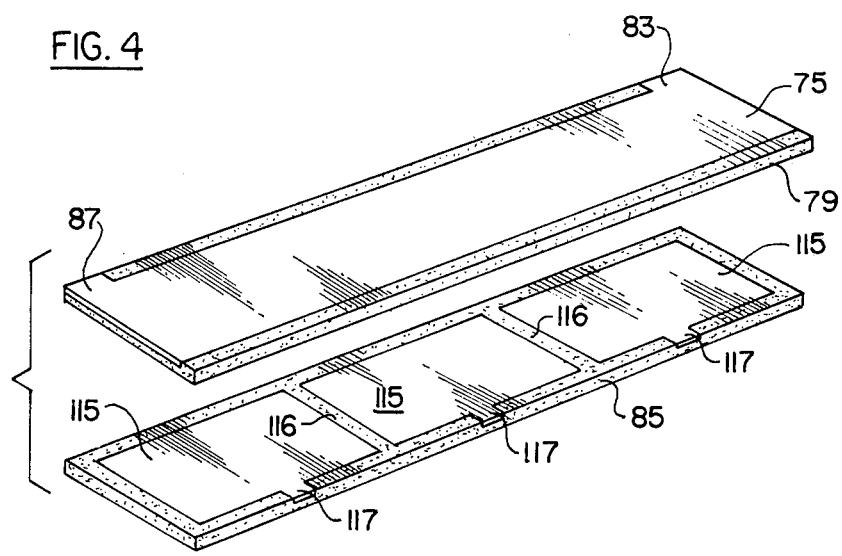
FIG. 4 is a perspective view similar to FIG. 2 showing a conductive sheet configuration for a low-pass filter.
Figure 5:
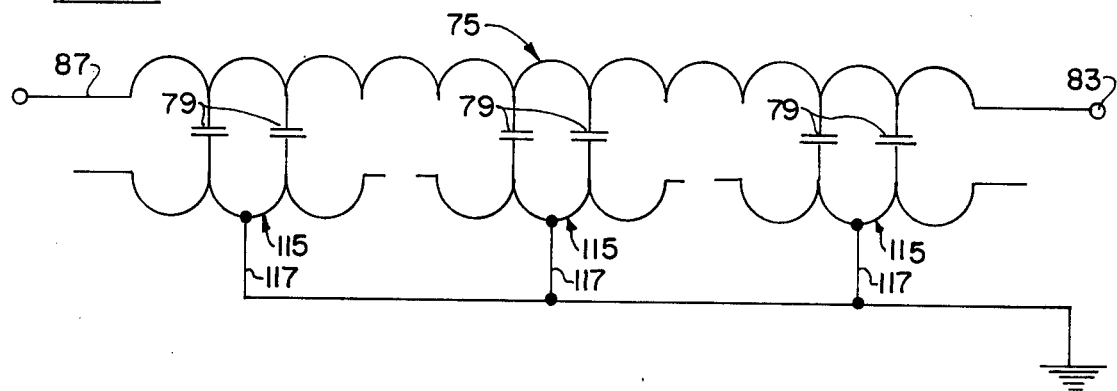
FIG. 5 is a schematic electrical diagram representing the equivalent circuit of the assembly of FIG. 4.

The two layers in FIG. 4 are rolled together to form inductances from the conductive layer 75, as represented by the equivalent circuit of FIG. 5. The terminals 87 and 83 form input and output terminals for the resulting low-pass filter, as do each of the conductive terminals 117. The resulting filter element is schematically shown by the equivalent circuit of FIG. 5, and it includes the inductive element 75 which is formed by rolling the conductive sheet 75 into inductive turns, and the plural capacitive elements 79 formed by the dielectric sheet 79 and the plural short conductive elements 115.

As shown schematically in FIG. 5, a typical low-pass filter configuration will connect each of the conductive terminals 17 to a common terminal, such as a grounded terminal so that the signals passed from the input terminal 87 to the output terminal 83 will be filtered in a typical low-pass configuration.

Figure 6:
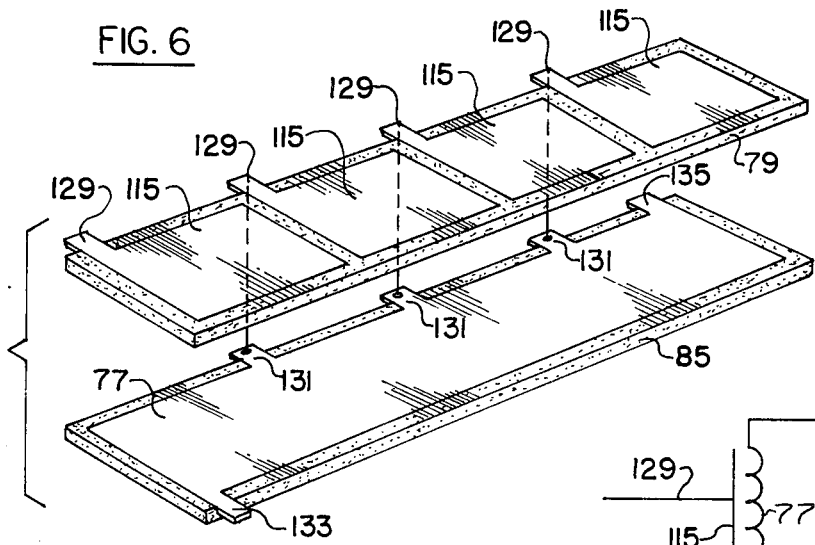
FIG. 6 is a perspective view similar to FIG. 2 showing a conductive sheet configuration for use in implementing a high-pass filter.

An additional example of the use of the basic embodiment of FIG. 1 is shown in FIG. 6, this figure illustrating the construction of a high-pass filter by varying the basic configuration and the terminal interconnections. The high-pass filter configuration of FIG. 6 may be accomplished by utilizing the basic embodiment of FIG. 1, the dielectric elements 79 and 85 of FIG. 4 along with the associated conductive element 77 being rolled to form the inductive turns. In the embodiment of FIG. 6, plural capacitive elements 115 are formed from the first conductive sheet 75, separated by margins 116, each of these capacitive elements 115 including a terminal 129 which is connected to adjacent terminals 131 of the conductive sheet 77 which is used as the inductive element. The length of the capacitive elements 115 should be less than one equivalent turn. The conductive sheet 77 includes a common pair of input/output terminals 133 and 135, and the first capacitive element 115 includes a terminal 129 for connection to external signals.

Figure 7:
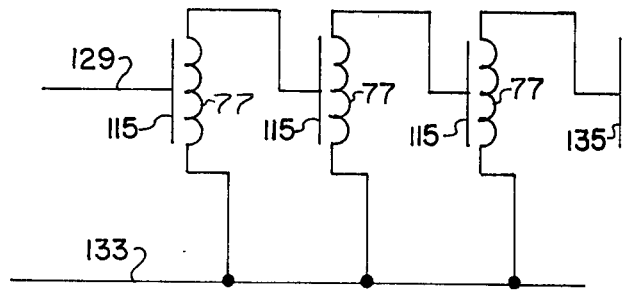
FIG. 7 is a schematic electrical diagram of the equivalent circuit of the assembly of FIG. 6.

The schematic illustration of FIG. 7 shows the equivalent circuit diagram of the assembly of FIG. 6, in which terminals 129 and 133 are utilized for receiving an input signal, and terminals 133 and 135 are utilized as output terminals. Series capacitive elements are connected by parallel inductance elements 77 to the common terminal 133, which results in a classic high-pass filter configuration.

By altering the component interconnections and the particular form of each of the conductive layers, the circuit component of the invention, as can be seen from the various examples given, may be formed in a variety of circuit configurations to provide a variety of filtering functions. In each case, a thin sheet of conductive material is formed to provide an inductive element with a flat side of the sheet being capacitively coupled to form the capacitive section in the circuit configuration, the inductive element having a surface which conforms with the surface of the coupling element to enhance conductive coupling.

Figure 8:
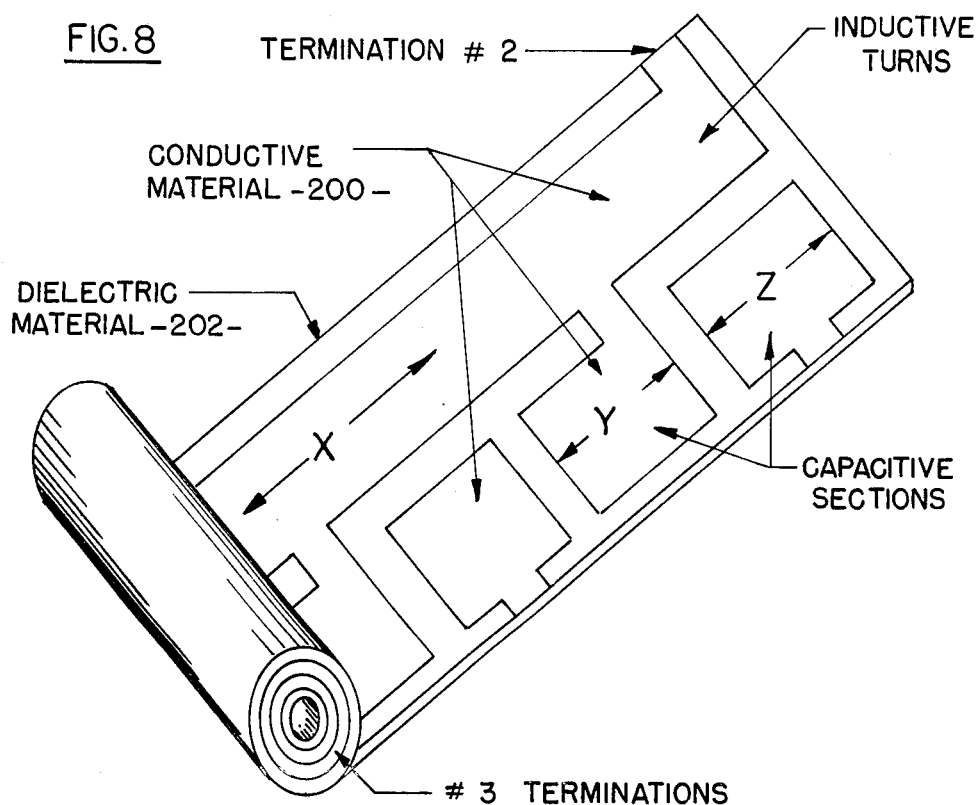
FIG. 8 is another rolled sheet version of a low-pass monolithic filter representing another embodiment of the invention, in which the conductive sheets are formed on a single dielectric sheet.
Figure 9:
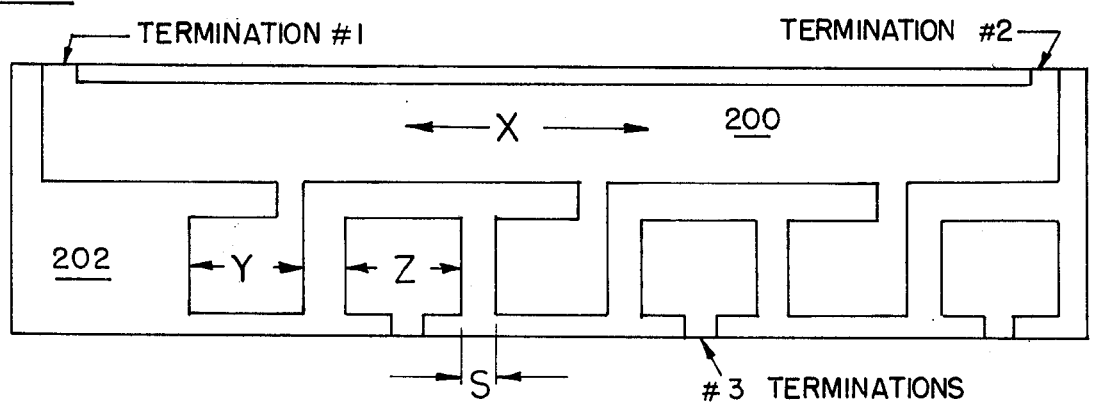
FIG. 9 is a further representation of the embodiment of FIG. 8, with the dielectric sheet and the supported conductive sheets being shown in a rolled-out flat form, whereas the representation of FIG. 8 shows the assembly in a partially spiralled form.

The assembly of FIGS. 8 and 9 is a rolled sheet version of a low-pass monolithic filter using, as mentioned above, a single dielectric sheet, although the concept of rolling a single sheet of dielectric material with appropriate conductive patterns thereon is by no means restricted to low-pass filters. The conductive material 200 is applied to the dielectric material 202 to form a continuous path "X", and when rolled into n turns, provides a value of self-inductance; and the material deposited to one side of the inductance X is arrayed in pads to produce nodes of capacitance.

Figure 10:
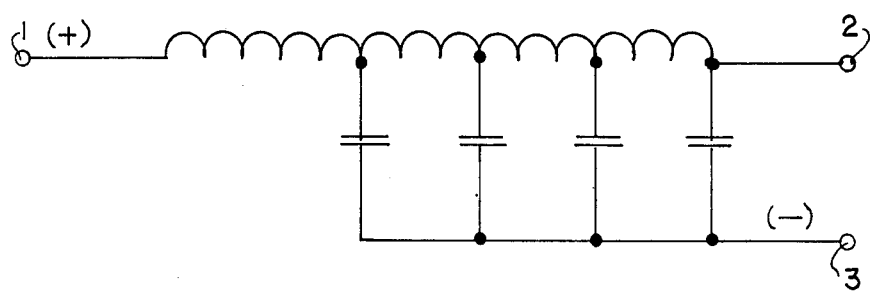
FIG. 10 is a circuit diagram of the equivalent circuit of the assembly of FIGS. 8 and 9.

For example, pad "Y" is connected to the inductive pad X and is one electrode of a capacitor, while pad "Z" is connected to ground and is therefore the negative electrode of the capacitor. Pads Y and Z are designed to comprise less than one turn of the rolled-up assembly in order to eliminate the effects of mutual inductance from being generated in the capacitive elements. The separation between the pads, designated "S", must be sufficiently precise so that the pads Y and Z will be matched to each other and not excessively overlap which would cause a resulting waste of material and reduced capacitance values. The ground terminations 3 (FIG. 10). can be made across the whole end of one end of the rolled-up assembly, while the positive terminations 1 and 3 can be made on the other end of the rolled-up assembly at their appropriate points. The entire rolled-up assembly can be encapsulated as an air core device, or it can be provided with a magnetic core which may be tunable, if so desired.

A presently preferred embodiment of the low-pass filter is shown in FIG. 11 in which the entire filter is formed on a single dielectric substrate 300 which simplifies the manufacturing process, as was the case in the embodiment of FIG. 9. The conductive sheets 302 and 304 form the inductive element, and the inductive sheets 306, 307, 308, 310 and 312 form the capacitive elements. The taps 1, 2, 3, 4, 5, 6, 7 can all be formed by conductive coatings on one end of the roll; and the taps 9 and 10 can be formed by conductive coatings on the other end of the roll. The conductive sheets 306 and 312 could be eliminated since they are actually redundant. However, the use of the sheets 306 and 312 is preferred since they tend to reduce leakage. The equivalent circuit is shown in FIG. 12.

The presently preferred embodiment for the high-pass filter is shown in FIG. 13. It comprises capacitive conductive sheet 3. Connections may be made to the conductive sheet by way of the illustrated tap. The equivalent circuit is shown in FIG. 14.

In the event difficulties are encountered in forming the two right-handed taps in FIG. 12 because of the close proximity of a (+) and a (−) tap, connection may be made to the conductive sheet 5 through metal-filled holes A and B, as shown in FIG. 15.

The invention provides, therefore, a circuit component which comprises the integration of inductance and capacitance in a monolithic structure. The resulting structure functions as a multi-pole filter to exhibit sharp roll-off characteristics due to high quality factor, and which the effects of shorted turns and inductive coupling are substantially eliminated.

While particular embodiments of the invention have been shown and described, modifications may be made, It is intended in the claims to cover the modifications which come within the spirit and scope of the invention.

What is claimed is:

1. An electrical component comprising: at least one electrically conductive sheet constituting an inductive element and at least one electrically conductive sheet constituting a capacitive element; at least one dielectric sheet formed of electrically insulating material and supporting the conductive sheets as conductive layers thereon in displayed relationship with respect to one another, with said dielectric sheet being generally larger than said conductive sheets to provide a margin area on said dielectric sheet, said electrically conductive sheets and said dielectric sheet being formed into a spiral roll, in which the conductive sheets are embedded into the surface of the dielectric sheet so that the surfaces of the conductive sheets and the dielectric sheet are flush with one another.

2. An electrical component comprising: at least one electrically conductive sheet constituting an inductive element and at least one electrically conductive sheet constituting a capacitive element; at least one dielectric sheet formed of electrically insulating material and supporting the conductive sheets as conductive layers thereon in displaced relationship with respect to one another, with said dielectric sheet being generally larger than said conductive sheets to provide a margin area on said dielectric sheet, said electrically conductive sheets and said dielectric sheet being formed into a spiral roll, and which includes a plurality of the second-named conductive sheets to provide a plurality of mutually insulated conductive sections on the dielectric sheet to serve as capacitive elements.

3. An electrical component comprising: at least one electrically conductive sheet constituting an inductive element and at least one electrically conductive sheet constituting a capacitive element; at least one dielectric sheet formed of electrically insulating material and supporting the conductive sheets as conductive layers thereon is displaced relationship with respect to one another, with said dielectric sheet being generally larger than said conductive sheets to provide a margin area on said dielectric sheet, said electrically conductive sheets and said dielectric sheet being formed into a spiral roll, in which the first-named conductive sheet extends from one end to the other of the dielectric sheet, and which includes a plurality of the second-named conductive sheets mounted on the same dielectric sheet adjacent to and displaced from said first-named conductive sheet with certain ones of the second-named conductive sheets being connected to the first-named conductive sheet.

4. An electrical component comprising: at least one electrically conductive sheet constituting an inductive element and at least one electrically conductive sheet constituting a capacitive element; at least one dielectric sheet formed of electrically insulating material and supporting the conductive sheets as conductive layers thereon in displaced relationship with respect to one another, with said dielectric sheet being generally larger than said conductive sheets to provide a margin area on said dielectric sheet, said electrically conductive sheets and said dielectric sheet being formed into a spiral roll, and which includes a plurality of the first-named electrically conductive sheets mounted on the dielectric sheet in displaced relationship with one another, and which includes a plurality of the second-named conductive sheets mounted on said dielectric sheet in spaced relationship with one another and interposed between the first-named electrically condutive sheets.

5. An electrical component comprising: at least one electrically conductive sheet constituting an inductive element and at least one electrically conductive sheet constituting a capacitive element; at least one dielectric sheet formed of electrically insulating material and supporting the conductive sheets as conductive layers thereon in displaced relationship with respect to one another, with said dielectric sheet being generally larger than said conductive sheets to provide a margin area on said dielectric sheet, said electrically conductive sheets and said dielectric sheet being formed into a spiral roll, and which includes a plurality of the second-named conductive sheets mounted on said dielectric sheet at each end of the first-named electrically conductive sheet in spaced relationship with respect thereto and to one another, with selected ones of the second-named conductive sheets being connected to the first-named conductive sheet.

* * * * *